(12) United States Patent
Tran

(10) Patent No.: US 6,982,544 B2
(45) Date of Patent: *Jan. 3, 2006

(54) SYSTEM AND METHOD OF BATTERY CAPACITY REPORTING

(75) Inventor: Phat H. Tran, Kitchener (CA)

(73) Assignee: Research In Motion Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 10/942,546

(22) Filed: Sep. 16, 2004

(65) Prior Publication Data

US 2005/0029988 A1 Feb. 10, 2005

Related U.S. Application Data

(63) Continuation of application No. 10/189,714, filed on Jul. 3, 2002, now Pat. No. 6,794,852.

(60) Provisional application No. 60/303,129, filed on Jul. 5, 2001.

(51) Int. Cl.
*H01M 10/46* (2006.01)

(52) U.S. Cl. .................................... 320/132

(58) Field of Classification Search ............... 320/132, 320/134, 135, 136, DIG. 21, 149; 324/427, 324/432, 433; 429/90, 100; D13/103
See application file for complete search history.

(56) References Cited

U.S. PATENT DOCUMENTS

| | | |
|---|---|---|
| 5,900,718 A | 5/1999 | Tsenter |
| 6,072,299 A | 6/2000 | Kurle et al. |
| 6,265,848 B1 | 7/2001 | Mukainakano |
| 6,586,940 B2 | 7/2003 | Asakura et al. |

OTHER PUBLICATIONS

Smart Battery System (SMBus) @ http://www.smbus.org/, Intel Corp., Feb. 15, 1995 (1 pg).

*Primary Examiner*—Edward H. Tso
(74) *Attorney, Agent, or Firm*—Jones Day; Krishna K. Pathiyal; Robert C. Liang

(57) ABSTRACT

A method and system for accurately reporting battery capacity is disclosed herein. The disclosed method and system prevent the reporting of discontinuous capacity values resulting from starting or stopping recharge cycles. The disclosed method and system prevent over or under reporting of battery capacity due to the transition between charge and discharge curves in a battery model.

20 Claims, 11 Drawing Sheets

SYSTEM AND METHOD OF BATTERY CAPACITY REPORTING

This is a continuation of Ser. No. 10/189,714, filed Jul. 3, 2002 now U.S. Pat. No. 6,794,852 which claims the benefit of Provisional Application No. 60/303,129, filed Jul. 5, 2001.

FIELD OF THE INVENTION

The present invention relates generally to batteries. More particularly, the present invention relates to reporting of the capacity of a battery.

BACKGROUND OF THE INVENTION

Many mobile computing and communicating devices rely upon standard battery cells for providing power on which to operate. Though disposable battery cells, such as alkaline cells, are a well-known and reliable technology, it is common in such mobile devices to employ rechargeable battery cells. These rechargeable batteries depend on a number of known cell types, including Ni-Cad, Ni-MH, and Li-Ion cells. All these cells are known to those of skill in the art, as are some of their deficiencies. One of the known deficiencies of the above mentioned rechargeable battery cells is related to the fact that each battery has a finite life span that can be measured in terms of recharge cycles. The process of charging and discharging the cell damages the cell's charge storage capabilities, causing the stored potential, which is typically measured in mA-hours, to decrease over the life of the battery. As the ability to store charge decreases, so does the battery's utility. The life of the battery can be drastically curtailed by improperly charging, or over discharging the battery. Another known deficiency of the above cell types is that the batteries are known to discharge while in storage, though some types of battery are more susceptible to the self-discharge phenomenon than others. As a result of these deficiencies, it is crucial that a user be able to determine the capacity of a battery both prior to and during use.

A state of the art technique for battery capacity reporting relies on the coulomb counter. The principle of operation involved in coulomb counting is computing a coulomb count equal to the coulombs injected into a battery minus the coulombs taken out of the battery. The capacity of the battery is then reported by comparing the coulomb count relative to a reference coulomb count value that corresponds to maximum battery capacity. For instance, if the coulomb count of a battery is half of the reference value, the battery capacity is reported to be 50 percent. Although the coulomb counter addresses battery capacity reporting, it may have several problems. First, the reported capacity may not be meaningful if an accurate reference coulomb count value corresponding to maximum battery capacity is not known. Furthermore, with a coulomb counter it may be difficult to keep an accurate reference coulomb count, particularly when battery capacity decreases over the lifetime of the battery. Further still, with a coulomb counter it may be necessary to know the current battery capacity before beginning the coulomb count.

A limitation of the coulomb counting principle is that it may not be applicable to reporting the capacity of a battery of initially unknown battery capacity: if the capacity of a battery is to be reported using the coulomb count system and method, the battery may have to be taken from it's unknown capacity state to either a fully charged 100 percent battery capacity state or to a fully discharged 0 percent capacity state before the coulomb count can be used. Because the state of the battery is unknown at a certain point, the only way to charge the battery to 100% capacity is to constantly provide charge over an extended length of time. This can result in an overcharging of the cell, which is known to damage to the storage capability of the cell. Conversely, to guarantee that the cell is at 0% capacity, the cell must be completely discharged. It is a known phenomenon that rechargeable batteries are damaged by a full discharge to a complete empty state. Thus forcing a battery to either 100% or 0% capacity will likely damage the cell, which only hastens the time at which the coulomb counting becomes inaccurate.

Further practical limitations exist with coulomb counting techniques. In practice, coulomb counting works by applying an integration over time. The presence of an offset in a coulomb counter may result in the inaccuracy of the coulomb count. This applies even to batteries with an assumed initially known battery capacity, and is compounded with every recharge cycle. This may be especially true if the battery needs to be used for a long period of time between opportunities to reset the coulomb counter. For instance, in a battery that needs to be used for 3 weeks between charges, even small offsets with each charge cycle may accumulate to large inaccuracies in reported capacity.

Other known techniques of battery capacity reporting exist, and are primarily based on measuring battery voltage. The interest in such voltage techniques is due to the technical ease involved in voltage measurement. However, voltage measurement techniques also present the greatest challenges since the relationship between battery voltage and battery capacity is plastic, i.e. for any given battery capacity, the measured battery voltage can vary greatly. The presence of such variations prevent the systematic reporting of meaningful battery capacity values. The variations are small if the current draw is fairly constant over the lifetime of the battery, so there are situations where a direct voltage to capacity mapping will suffice.

Many battery capacity reporting solutions assume a fairly constant current draw for the major mode of operation, and only report capacity in this mode. For example, most cell phones only report battery capacity when they are not charging. Once they start charging, their battery gauges stop indicating battery capacity. However, in applications where a battery is recharged while the system is running, such a change in state from discharging to charging, or vice versa, may break any assumptions about constant current draw.

Batteries have known characteristic charge and discharge curves. FIG. 1 illustrates a charge curve 140 and a discharge 130 curve for a battery. These curves relate battery voltage 120 to percent capacity 110 for a rechargeable battery. The curves provide a model 100 for a battery. In the model, percent battery capacity 110 is related to battery voltage 120 in either a discharging state, shown by discharge curve 130, or the charging state shown by charge curve 140. Illustrated is a multiplicity of points such as point 132 on the discharging curve 130 and of point 142 on the charging curve. Interpolation can be used to provide capacity values 110 for voltages 120 that lie between points for which values are known.

In reference to FIG. 1, the details of a charge state capacity model 100 are described. The relationship between battery voltage 110, battery charge state and capacity 120 is illustrated by two curves 130,140. A first curve 140 corresponds to a positive battery charge current or charging battery charge state, and a second curve 130 corresponds to a negative battery charge current or discharging battery charge state.

Although not expressly shown in the drawings, the charge state capacity model 100 can use more than one pair of curves. Each curve is a function of both the battery charge current and the battery charge state. The charge state is used to select at least one curve from a multiplicity of charge curves. Each curve is a function of the battery charging current, and relates battery voltage to capacity. For example, when the battery is in a first charge state, such as the charging state, a first charge curve corresponding to the charging state is utilised. When the battery is in a second charge state, for instance the discharging state, a second charge curve corresponding to the discharge state is utilised. The charge curves are such that given a battery voltage value and a charge curve, it is possible to obtain a corresponding capacity value from the charge curve.

Though it is possible to determine the capacity of a battery by measuring the voltage of the battery and examining the model, it should be noted that the existence of two distinct curves presents a problem. When a battery is charging and is at 50% capacity, it has a defined voltage level. If the battery charging is terminated when the battery is at 50%, the voltage of the battery does not instantly decrease to the voltage that corresponds to 50% capacity on the discharge curve. Instead the voltage decays to that level over time. The voltage of a 50% battery in a charging state is equivalent to the voltage of a 60–70% battery in the discharging state. As a result, most voltage based battery capacity reporting devices report a capacity jump when charging is ended. Similarly, there is a reported battery capacity drop when charging is started. These abrupt changes in capacity are inaccurate, and cause confusion among users.

There remains a further need for a system and method of battery capacity reporting based on battery voltage that overcomes the limitations present in the plastic relationship between battery voltage and battery capacity.

There remains a further need still for a system and method of battery capacity reporting which systematically reports a meaningful battery capacity value whether the battery is being discharged or charged, and which does so regardless of the presence of transitions between the charging and discharging of the battery.

SUMMARY OF THE INVENTION

It is an object of the present invention to obviate or mitigate at least one disadvantage of previous battery capacity reporters. It is a further object of the present invention to provide a system and method for battery capacity reporting based on battery voltage that is robust against inaccuracies in initial battery capacity estimations and which systematically provides a meaningful reported battery capacity value.

In a first aspect, the present invention provides a method of determining the available battery capacity of a battery. In the method, a battery voltage and a current charge state of the battery are determined. These determined values are then used to determine a target battery capacity. The determined battery capacity is compared to a previous battery capacity, and the target battery capacity is adjusted if the comparison is not indicative of the determined charge state. In an embodiment of the present invention, the method further includes either or both of the steps of reporting the target battery capacity and storing the reported capacity as the previous battery capacity.

In a further embodiment of the first aspect of the present invention the two defined charge states are a charging state, and a discharging state. In the charging state, a target battery capacity less than the previous battery capacity is not indicative of the charge state, while a target battery capacity greater than the previous battery capacity is not indicative of the discharging state. In a further embodiment, determining the battery capacity is done by examining a predetermined model of the correlation between voltage, charge state and capacity.

In other embodiments of the present invention adjusting the target capacity can involve changing the target capacity to the value of the previous battery capacity value or changing the target capacity to a capacity determined from a predefined fast transition curve that models the relationship between the determined battery voltage, the determined current charge state and battery capacity. In a further embodiment to the first aspect of the present invention, there is provided, prior to the step of reporting, an adjustment step for adjusting the target capacity to a capacity determined from a predefined slow transition curve. The slow transition curve models the relationship between the determined battery voltage, the determined current charge state and battery capacity, when the target capacity is in a play region around the capacity of the battery when the last change in charge state occurred.

Further aspects of the first aspect of the present invention provide a further adjustment of the target battery capacity based on an effective serial resistance correction factor or to compensate for temperature fluctuations.

A second aspect of the present invention provides a system for determining the capacity of a battery with a memory for storing a previous battery capacity value. The system has voltage reading means, charge state determining means, target capacity determining means, a comparator and target capacity adjusting means. The voltage reading means are operatively connected to the battery to determine the voltage of the battery. The charge state determining means are operatively connected to the battery to determine the charge state of the battery. The target capacity determining means, are operatively connected to the voltage reading means to receive the determined voltage and to the charge state determining means to receive the determined charge state, so that they can compute a target battery capacity based on the determined voltage and the determined charge state. The comparator is operatively connected to the memory to receive the previous battery capacity value and to the target capacity determining means to receive the target battery capacity, it generates a comparison signal representative of the comparison of the previous battery capacity value and the target battery capacity. The target capacity adjusting means are operatively connected to the comparator to receive the comparison signal, to the target capacity determining means to receive the determined target battery capacity and to the charge state determining means to receive the determined charge state. The target capacity adjusting means adjust the determined target battery capacity if the comparison signal is not indicative of the determined charge state, and they also store the adjusted target battery capacity in the memory.

In an embodiment of the second aspect of the present invention there is provided reporting means, operatively connected-to the target capacity adjusting means for reporting the adjusted target battery capacity.

In various embodiments, the target capacity adjusting means further includes means for a number of functions.

One such function is to adjust the determined target capacity to a capacity determined from a predefined fast transition curve that models the relationship between the determined battery voltage, the determined current charge state and battery capacity after a change in charge state. Another such function is to adjust the target capacity to a capacity determined from a predefined slow transition curve that models the relationship between the determined battery voltage, the determined current charge state and battery capacity when the target capacity is in a play region around the capacity of the battery when the last change in charge state occurred.

In another embodiment the target capacity adjusting means is also connected to an effective serial resistance tester which is operatively connected to the battery to determine an effective serial resistance correction factor, the target capacity adjusting means further includes means for adjusting the target capacity based on the effective serial resistance correction factor.

In a presently preferred aspect the above described system is integrated into a handheld computing or communicating device.

Other aspects and features of the present invention will become apparent to those ordinarily skilled in the art upon review of the following description of specific embodiments of the invention in conjunction with the accompanying FIGS.

BRIEF DESCRIPTION OF THE DRAWINGS

Embodiments of the present invention will now be described, by way of example only, with reference to the attached FIGS., wherein.

DETAILED DESCRIPTION

Generally, the present invention provides a method and system for measuring and reporting battery capacity.

Figure 2:
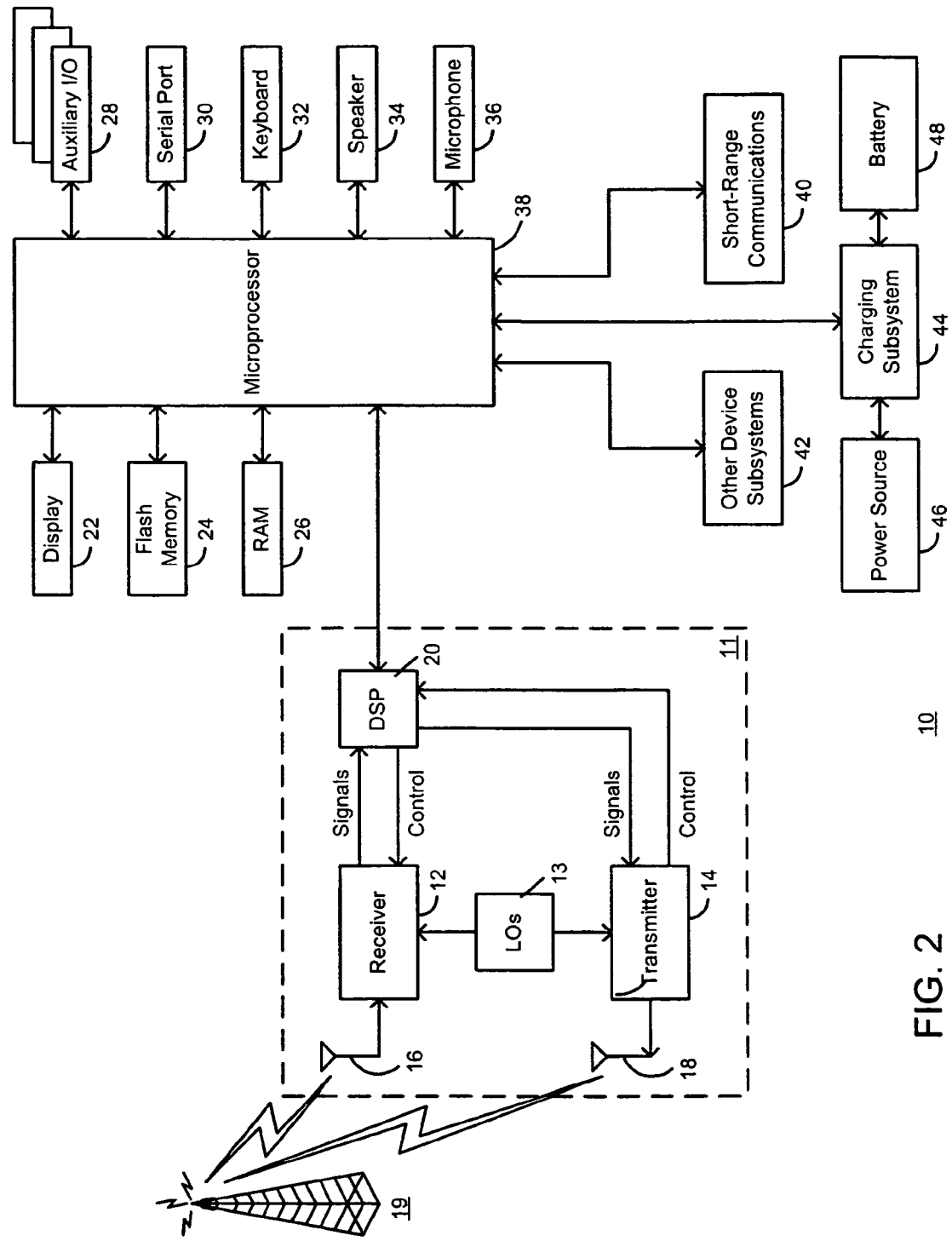
FIG. 2 is a block diagram of a mobile communication device in which the instant invention may be implemented.

FIG. 2 is a block diagram of a mobile communication device 10 in which the instant invention may be implemented. The mobile communication device 10 is preferably a two-way communication device having at least voice or data communication capabilities. The device preferably has the capability to communicate with other computer systems on the Internet. Depending on the functionality provided by the device, the device may be referred to as a data messaging device, a two-way pager, a cellular telephone with data messaging capabilities, a wireless Internet appliance or a data communication device (with or without telephony capabilities). It will be apparent to one of skill in the art that batter capacity reporting and measurement has applications that are not limited to the field of mobile communicating and computing devices.

Where the device 10 is enabled for two-way communications, the device will incorporate a communication subsystem 11, including a receiver 12, a transmitter 14, and associated components such as one or more, preferably embedded or internal, antenna elements 16 and 18, local oscillators (LOs) 13, and a processing module such as a digital signal processor (DSP) 20. As will be apparent to those skilled in the field of communications, the particular design of the communication subsystem 11 will be dependent upon the communication network in which the device is intended to operate. For example, a device 10 destined for a North American market may include a communication subsystem 11 designed to operate within the Mobitex™ mobile communication system or DataTAC™ mobile communication system, whereas a device 10 intended for use in Europe may incorporate a General Packet Radio Service (GPRS) communication subsystem 11.

Network access requirements will also vary depending upon the type of network 19. For example, in the Mobitex™ and DataTAC™ networks, mobile devices such as 10 are registered on the network using a unique personal identification number or PIN associated with each device. In GPRS networks however, network access is associated with a subscriber or user of a device 10. A GPRS device therefore requires a subscriber identity module (not shown), commonly referred to as a SIM card, in order to operate on a GPRS network. Without a SIM, a GPRS device will not be fully functional. Local or non-network communication functions (if any) may be operable, but the device 10 will be unable to carry out any functions involving communications over network 19. When required network registration or activation procedures have been completed, a device 10 may send and receive communication signals over the network 19. Signals received by the antenna 16 through a communication network 19 are input to the receiver 12, which may perform such common receiver functions as signal amplification, frequency down conversion, filtering, channel selection and analog-digital conversion. Analog to digital conversion of a received signal allows complex communication functions, such as demodulation and decoding, to be performed in the DSP 20. In a similar manner, signals to be transmitted are processed, including modulation and encoding for example, by the DSP 20 and input to the transmitter 14 for digital to analog conversion, frequency up conversion, filtering, amplification and transmission over the communication network 19 via the antenna 18.

The DSP 20 not only processes communication signals, but also provides for receiver and transmitter control. For example, the gains applied to communication signals in the receiver 12 and transmitter 14 may be adaptively controlled through automatic gain control algorithms implemented in the DSP 20.

The device 10 preferably includes a microprocessor 38 which controls the overall operation of the device. Communication functions, including at least one of data and voice communications, are performed through the communication subsystem 11. The microprocessor 38 also interacts with further device subsystems such as the display 22, flash memory 24, random access memory (RAM) 26, auxiliary input/output (I/O) subsystems 28, serial port 30, keyboard 32, speaker 34, microphone 36, a short-range communications subsystem 40 and any other device subsystems generally designated as 42.

Some of the subsystems shown in FIG. 2 perform communication-related functions, whereas other subsystems may provide "resident" or on-device functions. Notably, some subsystems, such as keyboard 32 and display 22 for example, may be used for both communication-related functions, such as entering a text message for transmission over a communication network, and device-resident functions such as a calculator or task list.

Operating system software used by the microprocessor 38 is preferably stored in a persistent store such as flash memory 24, which may instead be a read only memory (ROM) or similar storage element (not shown). Those skilled in the art will appreciate that the operating system, specific device applications, or parts thereof, may be temporarily loaded into a volatile store such as RAM 26. It is contemplated that received communication signals may also be stored to RAM 26.

The microprocessor 38, in addition to its operating system functions, preferably enables execution of software applications on the device. A predetermined set of applications which control basic device operations, including at least data and voice communication applications for example, will normally be installed on the device 10 during manufacture. A preferred application that may be loaded onto the device may be a personal information manager (PIM) application having the ability to organise and manage data items relating to the device user such as, but not limited to e-mail, calendar events, voice mails, appointments, and task items. Naturally, one or more memory stores would be available on the device to facilitate storage of PIM data items on the device. Such PIM application would preferably have the ability to send and receive data items, via the wireless network. In a preferred embodiment, the PIM data items are seamlessly integrated, synchronised and updated, via the wireless network, with the device user's corresponding data items stored or associated with a host computer system thereby creating a mirrored host computer on the mobile device with respect to the data items at least. This would be especially advantageous in the case where the host computer system is the mobile device user's office computer system. Further applications may also be loaded onto the device 10 through the network 19, an auxiliary I/O subsystem 28, serial port 30, short-range communications subsystem 40 or any other suitable subsystem 42, and installed by a user in the RAM 26 or preferably a non-volatile store (not shown) for execution by the microprocessor 38. Such flexibility in application installation increases the functionality of the device and may provide enhanced on-device functions, communication-related functions, or both. For example, secure communication applications may enable electronic commerce functions and other such financial transactions to be performed using the device 10.

In a data communication mode, a received signal such as a text message or web page download will be processed by the communication subsystem 11 and input to the microprocessor 38, which will preferably further process the received signal for output to the display 22, or alternatively to an auxiliary I/O device 28. A user of device 10 may also compose data items such as email messages for example, using the keyboard 32, which is preferably a complete alphanumeric keyboard or telephone-type keypad, in conjunction with the display 22 and possibly an auxiliary I/O device 28. Such composed items may then be transmitted over a communication network through the communication subsystem 11.

For voice communications, overall operation of the device 10 is substantially similar, except that received signals would preferably be output to a speaker 34 and signals for transmission would be generated based on an input received through a microphone 36. Alternative voice or audio I/O subsystems such as a voice message recording subsystem may also be implemented on the device 10. Although voice or audio signal output is preferably accomplished primarily through the speaker 34, the display 22 may also be used to provide an indication of the identity of a calling party, the duration of a voice call, or other voice call related information for example.

The serial port 30 in FIG. 2 would normally be implemented in a personal digital assistant (PDA)-type communication device for which synchronisation with a user's desktop computer (not shown) may be desirable, but is an optional device component. Such a port 30 would enable a user to set preferences through an external device or software application and would extend the capabilities of the device by providing for information or software downloads to the device 10 other than through a wireless communication network. The alternate download path may for example be used to load an encryption key onto the device through a direct and thus reliable and trusted connection to thereby enable secure device communication.

A short-range communications subsystem 40 is a further optional component which may provide for communication between the device 10 and different systems or devices, which need not necessarily be similar devices. For example, the subsystem 40 may include an infrared device and associated circuits and components or a Bluetooth™ communication module to provide for communication with similarly-enabled systems and devices.

A charging subsystem 44 is a component that provides power for the device 10 and different subsystems or devices. For example, the charging subsystem 44 may determine the presence of detachable power source device 46 and associated circuits, such as an AC adapter, USB bus, or car adapter to provide power for the device and to charge battery 48. Additionally, charging subsystem 44 may determine the absence of power source device 46, and consequently obtain power for the device 10 from battery 48. When the battery 48 powers device 10, the battery 48 is said to be in a discharging state. Conversely, when power source device 46 powers device 10, and charging subsystem charges battery 48, the battery is said to be in a charging state. The present invention is concerned with reporting the capacity of a battery such as battery 48.

The battery capacity reported is a function of several factors, including battery voltage, and battery charging current. The relationship between battery voltages, battery charging currents, and battery capacity is modelled using charge curves such as those illustrated in FIG. 1. Therefore, before describing embodiments of the method and system in detail, several concepts will be defined for greater certainty.

As used in this description and in the appended claims, the battery voltage is defined as the voltage differential between positive and negative terminals of the battery.

As used in this description and in the appended claims, the battery charging current is defined as a current flow into the battery. Battery charging current is capable of taking on a signed value, with a positive value meaning current being delivered into the battery and a negative value meaning current drawn out of the battery.

As used in this description and in the appended claims, charge state, also referred to as charging state, is defined as the sign of the corresponding battery charging current. Therefore reference to a positive charge state is synonymous with charging. Similarly, a negative charge state is synonymous with discharging. The use of either term is clear and unambiguous.

As used in this description and in the appended claims, a capacity model is defined as the relationship between battery voltage, battery charging current, and capacity so that given battery voltage and battery charging current, capacity can be determined by applying the capacity model.

Generally, the method of the present invention adjusts the reported battery capacity to eliminate abrupt discontinuities in the reported battery capacity. The charging state of the battery is determined, and is used to select either the charge or the discharge curve. The voltage of the battery is then read, and using the selected curve a preliminary, or target, capacity is determined. The preliminary capacity is compared to the last reported capacity. The comparison will show an increase in battery capacity while the battery is in a discharge state if the charging has been discontinued, or conversely will show a decrease in capacity while the battery is in the charge state if the charging has been started. Because this is known to be inaccurate, an adjustment is made in the preliminary battery capacity, and the adjusted capacity is reported. The reported capacity is then stored for use in the next cycle. The method of adjustment of the battery capacity can be as simple as reporting the previously reported value until the battery capacity follows the known charge and discharge curves, or it can involve an analysis of the reported voltage and a comparison of the reported voltage to a previously reported voltage to create a new curve through which the battery capacity varies. The methods of the adjustment are described in greater detail below.

Figure 1:
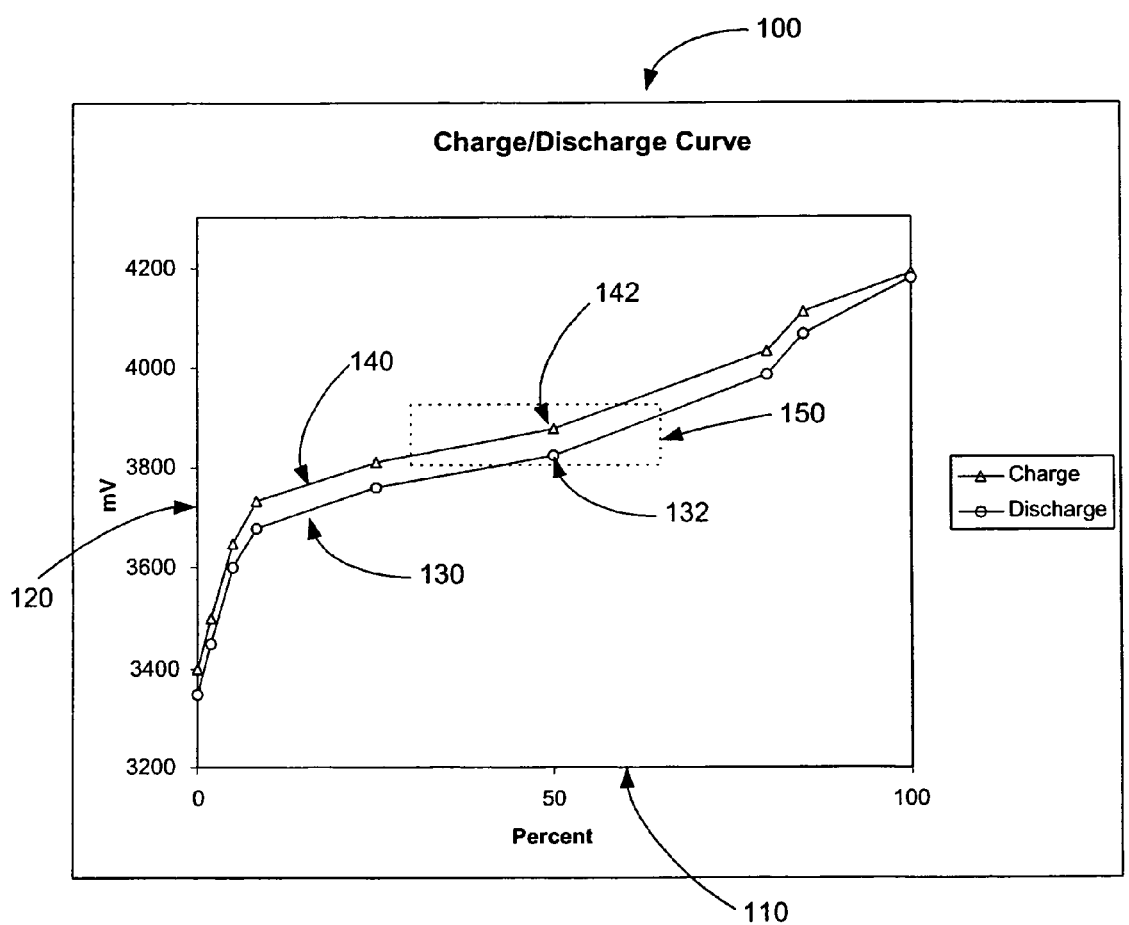
FIG. 1 illustrates two curves, a charge and a discharge curve, relating battery voltage to percent capacity for a rechargeable battery, in accordance with the present invention.

Referring to FIGS. 1 and 2, in a preferred embodiment, the method uses a system, such as device 10 of FIG. 2 including a charging subsystem 44, to assist in determining values for the battery voltage 120 and battery capacity. The charging current can be used to determine the charging state and select either one of the curves 130,140. The charging subsystem 44 is typically capable of performing several operations such as constant current charging operation, constant voltage charging operation, and no charging—or discharging—operation.

Figure 3:
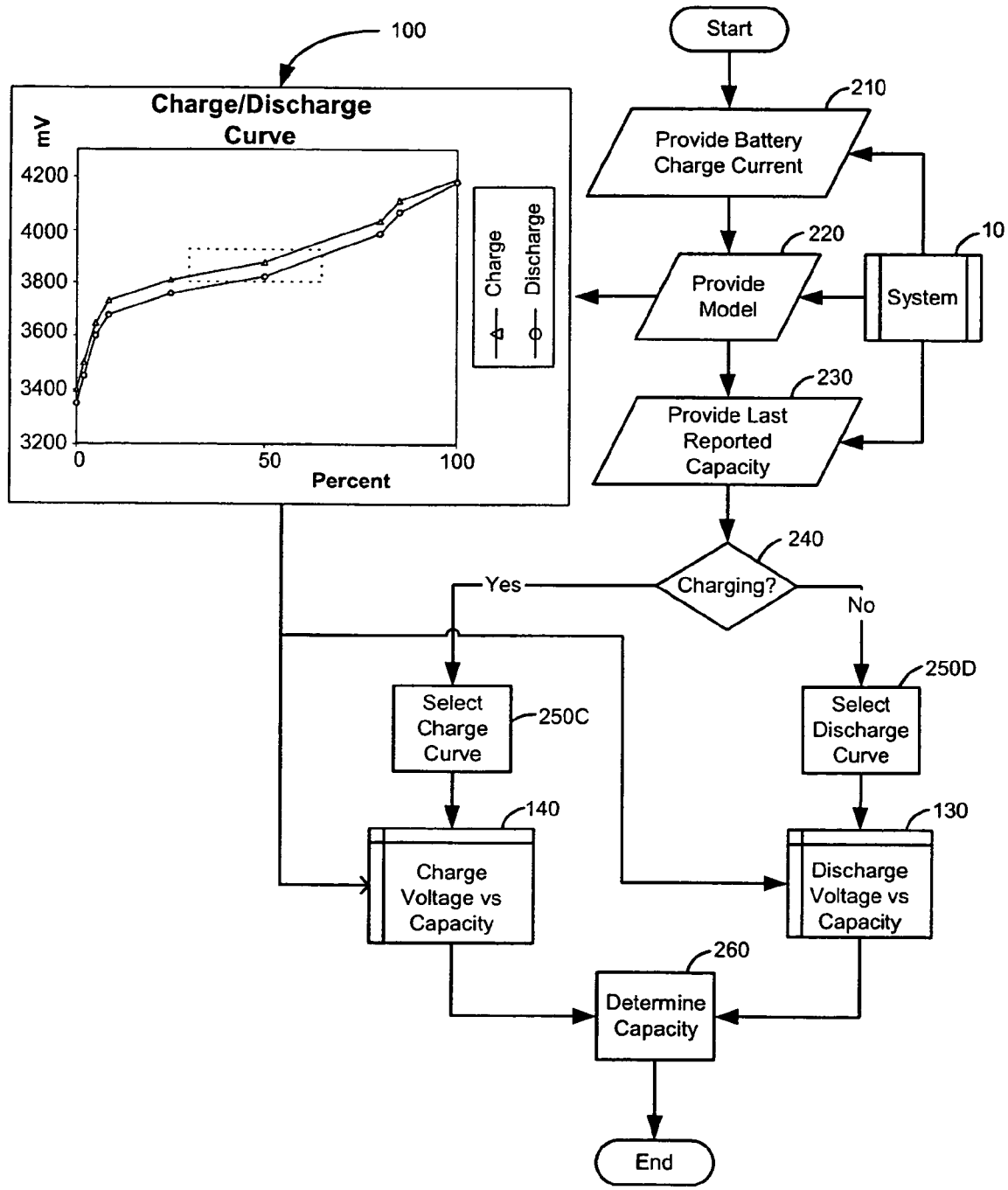
FIG. 3 is a flowchart illustrating a preferred embodiment of the method of battery capacity reporting, in accordance with the present invention.

Referring now to FIG. 3, a flowchart illustrating the preferred embodiment of the method of battery capacity reporting, is described in reference to its steps.

At step 210, the battery voltage 120 is determined. At step 220, a model 100 is provided, such as for example the model of FIG. 1. At step 230, the last reported capacity is provided. At step 240, a determination is made as to the charging state of the battery. For instance if the battery charging current is determined, the charging state can be derived from the sign of the charging current. Although not expressly shown in the drawings, these first four steps can in any order, or can performed simultaneously.

If at step 240, it is determined that the battery is charging, step 250C is taken. Conversely, if at step 240, it is determined that the battery is discharging, step 250D is taken. Step 250C selects the charge curve 140 whereas step 250D selects the discharge curve 130. At step 260, the charge curve model is applied to determine a capacity based on the determined battery voltage of step 210 and other factors.

Figure 5:
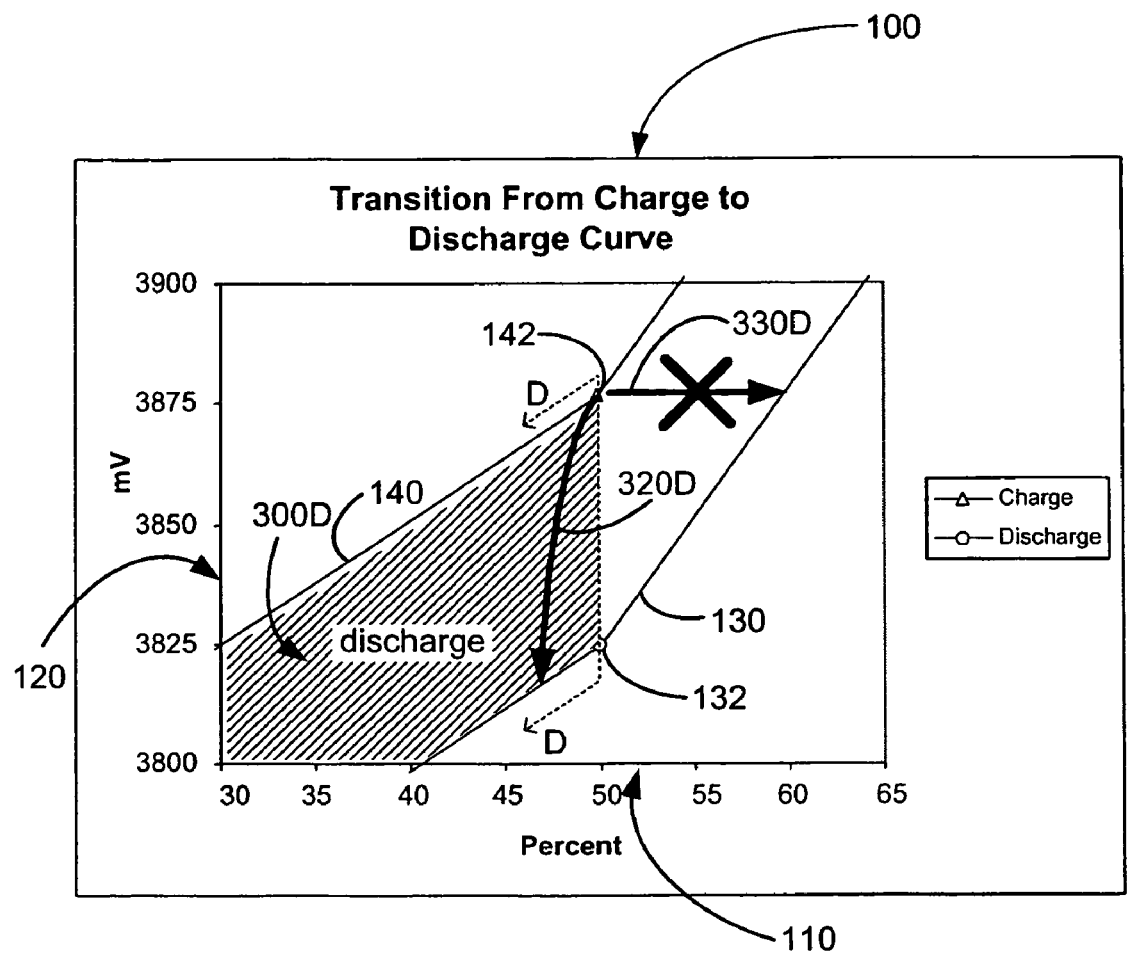
FIG. 5 illustrates a transition from the use of the charge curve to the use of the discharge curve of FIG. 4 in a first embodiment of a method to carry out step 260 of FIG. 3, in accordance to the present invention.
Figure 6:
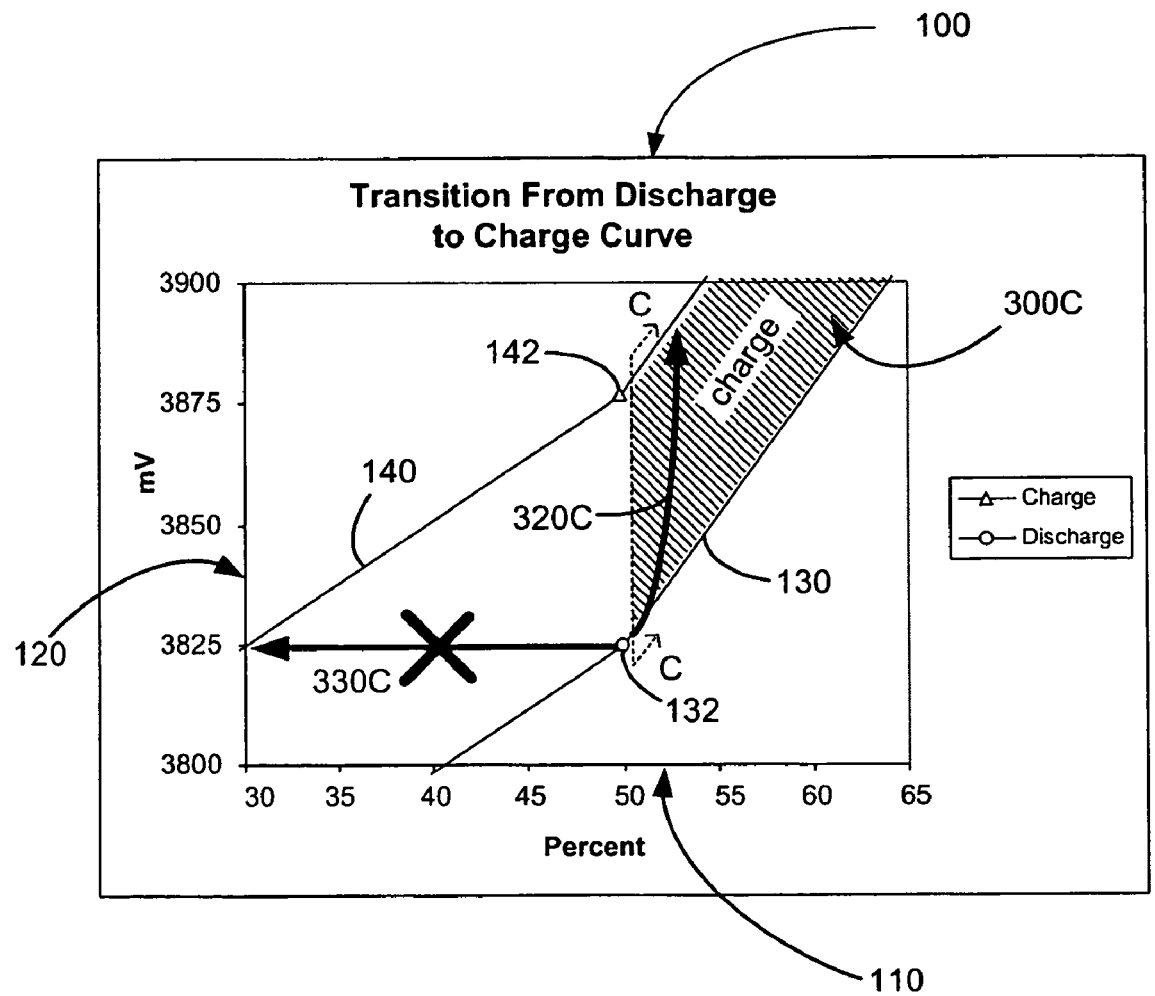
FIG. 6 illustrates a transition from the use of the discharge curve to the use of the charge curve of FIG. 4 in a first embodiment of a method to carry out step 260 of FIG. 3, in accordance to the present invention.
Figure 7:
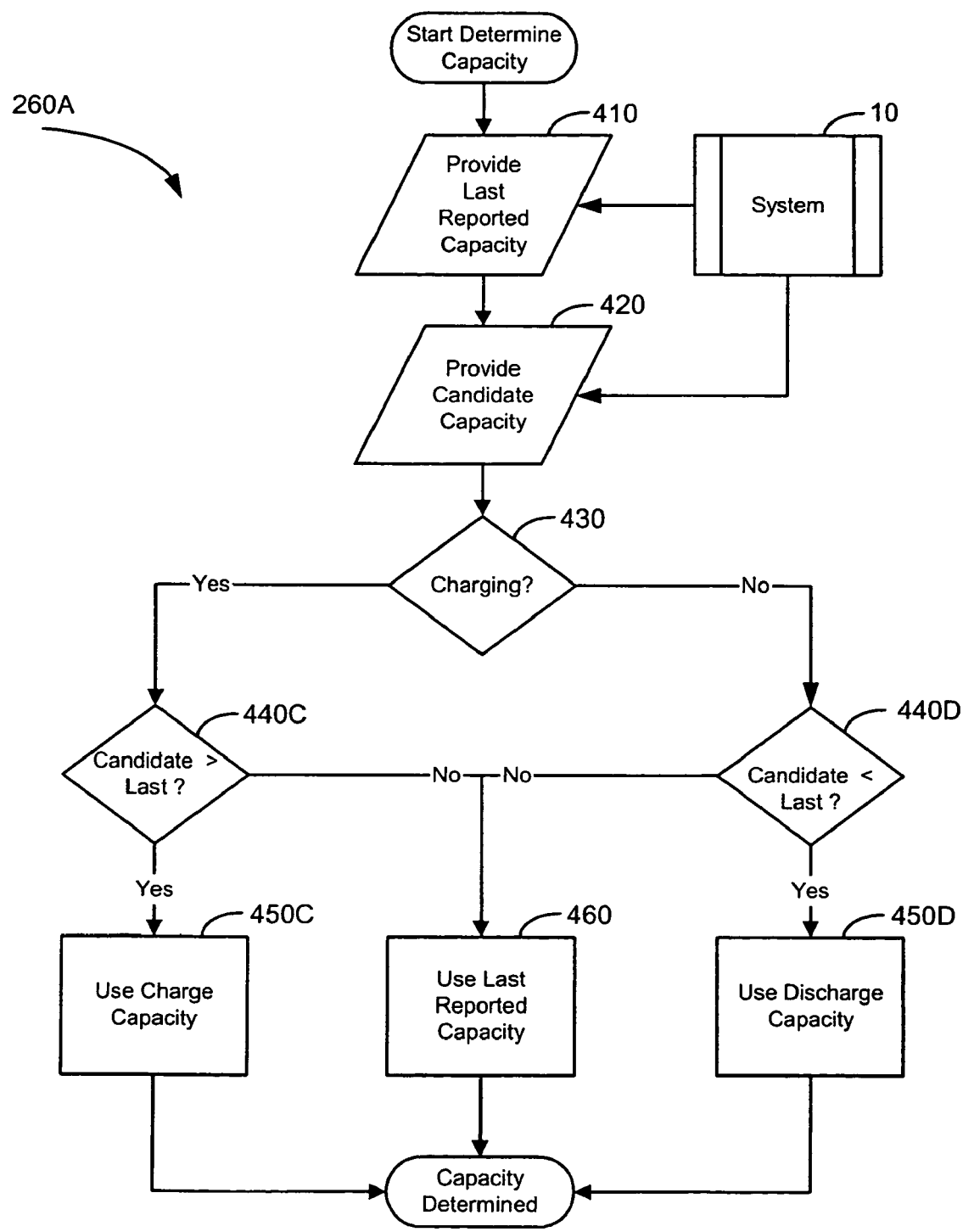
FIG. 7 is a flowchart illustrating a first embodiment of a method to carry out step 260 of FIG. 3, in accordance with FIGS. 5 and 6.
Figure 8:
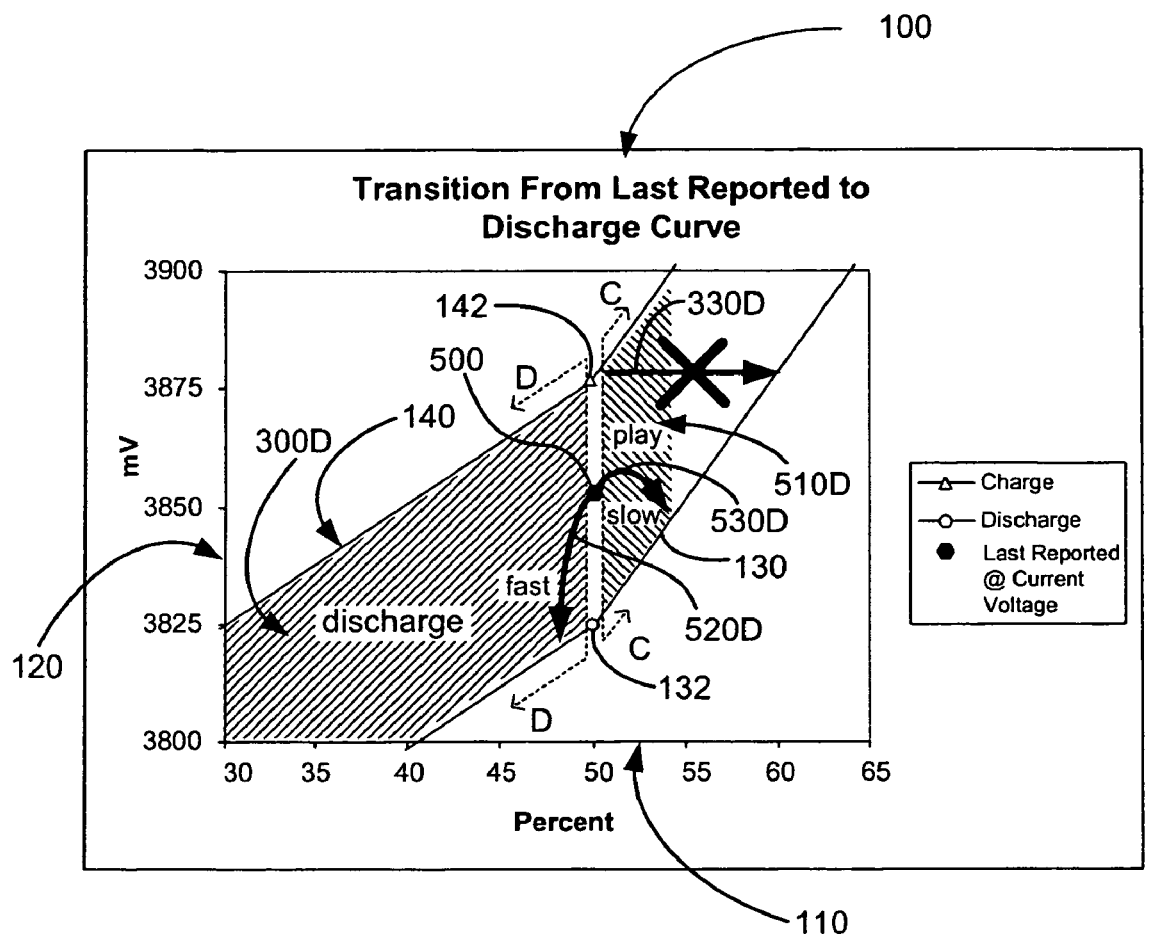
FIG. 8 illustrates a transition from the last reported capacity towards the discharge curve of FIG. 4 in a preferred embodiment of a method to carry out step 260 of FIG. 3, in accordance to the present invention.
Figure 9:
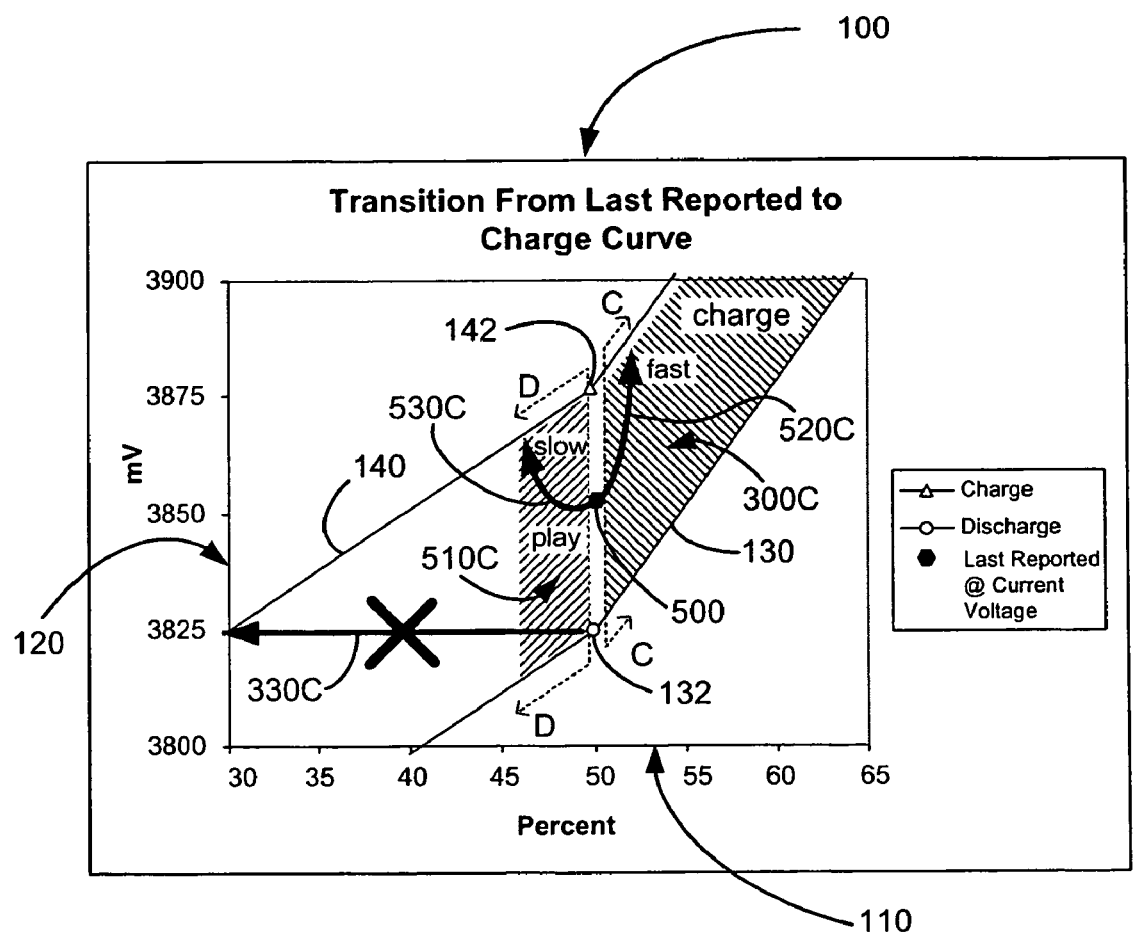
FIG. 9 illustrates a transition from the last reported capacity towards the charge curve of FIG. 4 in a preferred embodiment of a method to carry out step 260 of FIG. 3, in accordance with the present invention.
Figure 10:
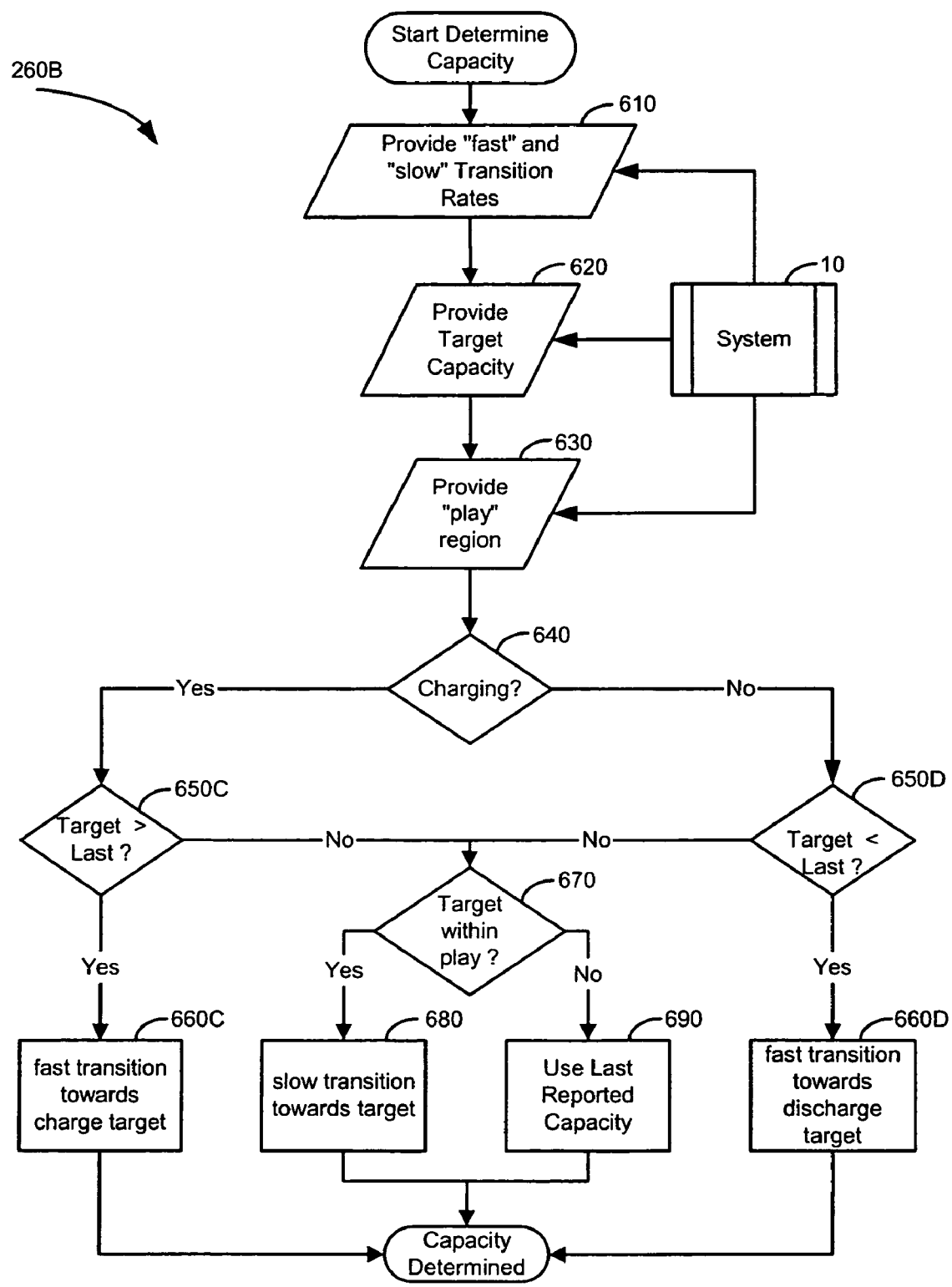
FIG. 10 is a flowchart illustrating a preferred embodiment of a method to carry out step 260 of FIG. 3, in accordance with FIGS. 8 and 9.
Figure 11:
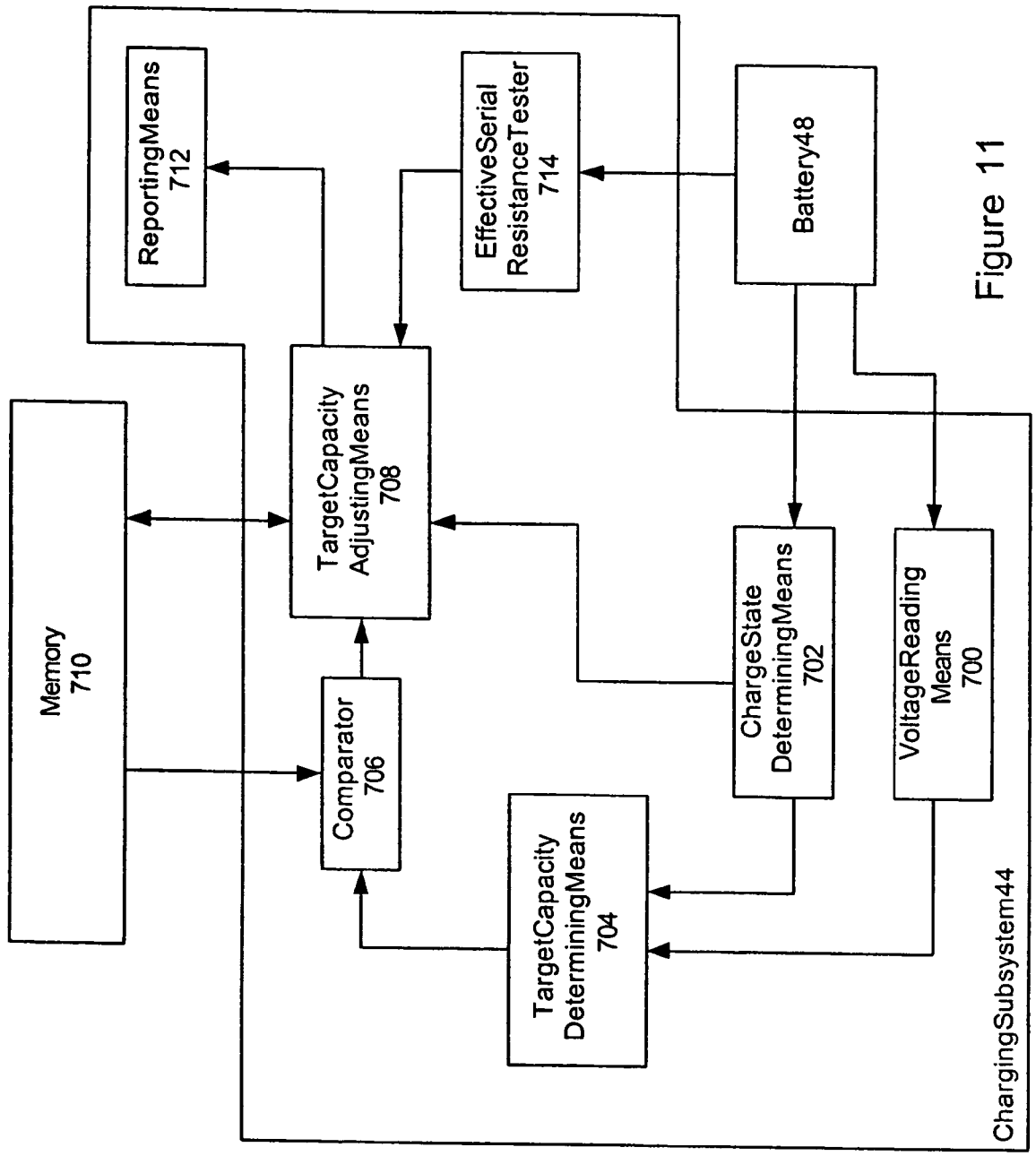
FIG. 11 is a block diagram illustrating an exemplary embodiment of a system of the present invention.

Two embodiments of a method to carry out step 260 are currently contemplated. FIGS. 5–7 illustrate a first embodiment. FIGS. 8–10 illustrate a second preferred embodiment which is easier to understand in view of the first. Both embodiments will be described in reference to FIG. 4.

Figure 4:
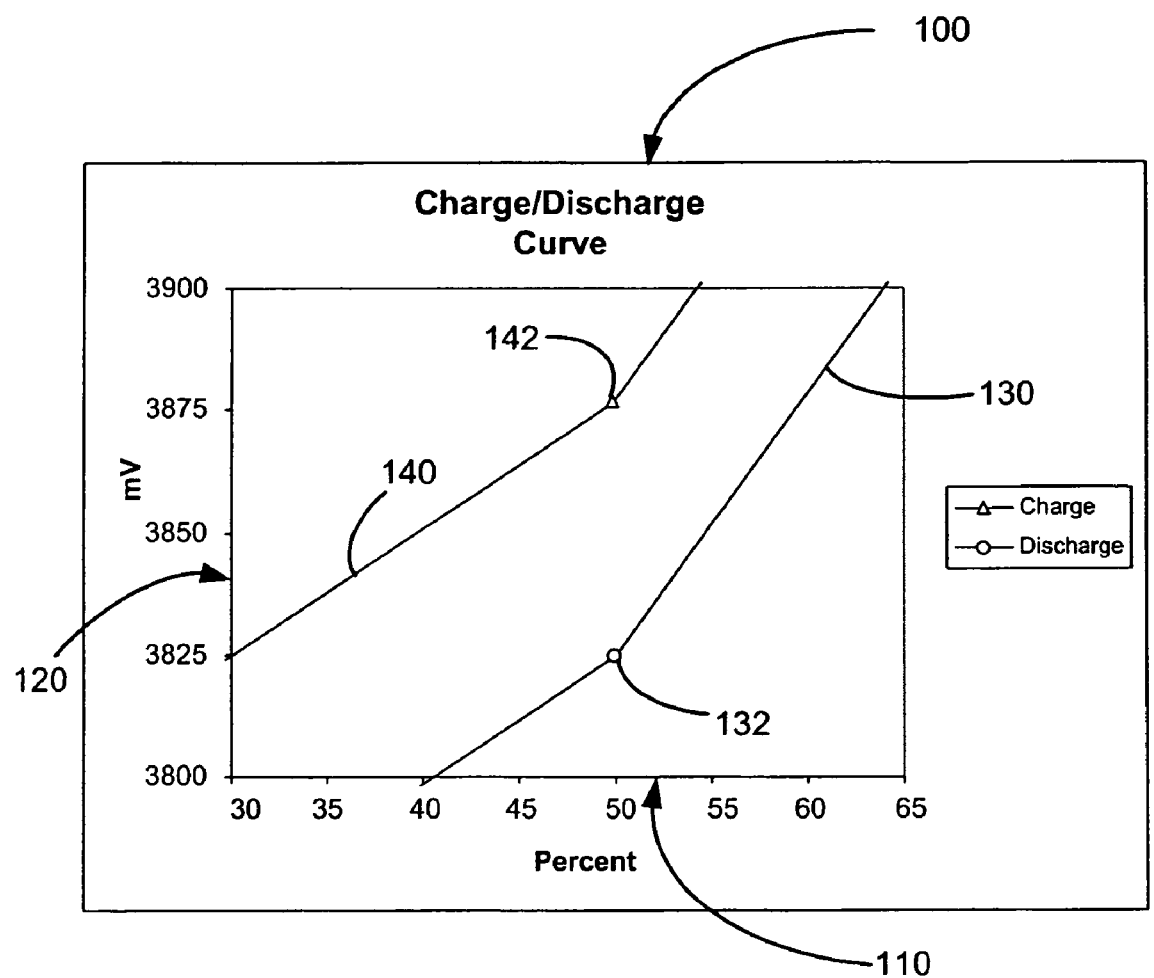
FIG. 4 is an enlarged version of a portion of FIG. 1, the portion bound by a dotted rectangle in FIG. 1.

FIG. 4 is an enlarged version of the dotted rectangular region 150 in FIG. 1. Shown is how the model 100 relates percent capacity 110 to battery voltage 120 for two charge states, the discharge state curve 130 with points 132 and the charge state curve 142.

In the charge state, the capacity model 100 uses an inherent property of battery charge current, the sign or charge state, to relate battery voltage to capacity as a function of charge state at step 260.

FIG. 5 illustrates a transition from the use of the charge curve 140 to the use of the discharge curve 130 of FIG. 4 in a first embodiment of a method to carry out step 260 of FIG. 3.

A battery 48 is assumed to be initially charging 140 and at voltage 120 of 3.875 V, corresponding to point 142. Consequently, a 50% capacity 110 is confidently determined. Next, the battery transitions to the discharging state, for instance if power source 46 of FIG. 2 is disconnected.

A battery that has been charging for a while and has a voltage reading of 3.875V, can be confidently gauged to be 50% full by directly mapping off the initial charge curve, corresponding to a charging state. If charging is turned off at this point, then the battery's voltage would have to drop immediately to 3.825V in order for it to map to 50% on the new charge curve, corresponding to a discharging state. However, what is observed is that the battery voltage actually takes some time (for instance tens of minutes, if not more than an hour) to settle to 3.825V from 3.875V after charging has stopped. During that time, mapping the voltage directly off the new charge curve 330D would yield a capacity value greater than 50%. If that value were reported directly, then the user would see a reported battery capacity jump up to around 60% when the device 10 is disconnected from the charger 46.

Line D—D defines a discharge region 300D. Two possible transitions between the charge and discharge curves are shown as transition 320D and transition 330D relative to initial charge point 142. Transitions 330D and 320D are illustrative only—several valid transitions such as 320D and invalid transitions such as 330D can be defined. They all have in common the fact that valid transitions 320D only allow the reported capacity to decrease when discharging, whereas invalid transitions 330D cause the reported capacity to increase while discharging.

FIG. 6 illustrates a transition from the use of the discharge curve 130 to the use of the charge curve 140 of FIG. 4 in a first embodiment of a method to carry out step 260.

A battery 48 is assumed to be initially discharging 130 and at voltage 120 of 3.825 V, corresponding to point 132. Consequently, a 50% capacity 110 is confidently determined. Next, the battery transitions to the charging state, for instance if power source 46 of FIG. 2 is connected.

A battery that has been discharging for a period of time and has a voltage reading of 3.825V can be confidently gauged to be 50% full by directly mapping off the initial charge curve, corresponding to a discharging state. If charging is turned on at this point, then the battery's voltage would have to rise immediately to 3.875V in order for it to map to 50% on the new charge curve, corresponding to a charging state. However, what is observed is that the battery voltage will actually take some time (for instance tens of minutes, if not more than an hour) to settle to 3.875V from 3.825V after charging has started. During that time, mapping the voltage directly off the new charge curve 330C would yield a capacity value lower than 50%. If that value were reported directly, then the user would see a reported battery capacity jump down to around 30% when the device 10 is connected to the charger 46.

Line C—C defines a charge region 300C. Two possible transitions between the charge and discharge curves are shown as transition 320C and transition 330C relative to initial discharge point 132. Transitions 330C and 320C are illustrative only—several valid transitions 320C and invalid transitions 330C can be defined. They all have in common the fact that valid transitions 320C only allow the reported capacity to increase when charging, whereas invalid transitions 330D would cause the reported capacity to decrease while charging.

FIG. 7 is a flowchart illustrating a first embodiment of a method to carry out step 260 of FIG. 3, in accordance to FIGS. 5 and 6.

System 10 provides the last reported capacity at step 410 and a candidate capacity at step 420. At step 430, a determination is made as to the charging state of battery 48, similar to step 240 already described in reference to FIG. 3. If the battery 48 is in the charging state, then steps 440C, 450C or 460 are taken. Conversely, if the battery is in the discharging state, then steps 440D, 450D or 460 are taken.

If the battery 48 is in the charging state, at step 440C, the candidate capacity provided in step 420 is compared to the last reported capacity provided in step 410. If the candidate capacity is greater than the last reported capacity, then at step 450C the candidate charge capacity provided at step 420 is used. Conversely, if the candidate capacity is less than or equal to the last reported capacity, the last reported capacity is used at step 460. This ensures that only charge transitions 320C of FIG. 6 occur, avoiding transitions of the type of 330C outside the charge region 300C.

If the battery 48 is in the discharging state, at step 440D, the candidate capacity provided in step 420 is compared to the last reported capacity provided in step 410. If the candidate capacity is less than the last reported capacity, then at step 450D the candidate discharge capacity provided at step 420 is used. Conversely, if the candidate capacity is greater than or equal to the last reported capacity, the last reported capacity is used at step 460. This ensures that only discharge transitions 320D of FIG. 5 occur, avoiding transitions of the type of 330D outside the discharge region 300D.

According to the method of FIG. 7, the reported capacity is only allowed to increase when the battery is in a charging state. Similarly, the reported capacity is only allowed to decrease when the battery is in a discharging state.

When a change in charge state occurs, from the first initial charge state to the second new charge state, it may take some time for the battery to reach a new dynamic equilibrium at the second charge state. During this transition period, it is possible that neither the charge curve corresponding to the initial charge state nor the charge curve corresponding to the new charge state provides a sufficiently accurate voltage-to-capacity mapping. For instance, in reference to FIGS. 5–6, a transition midway along line DD or CC would have a constant 50% last reported capacity but could have a voltage of 3.850 V, a point that is neither on the charge curve nor on the discharge curve. This concept leads to the preferred embodiment of a method to carry out step 260 of FIG. 3, which will be discussed presently in reference to FIGS. 8–10.

FIG. 8 illustrates a transition from the last reported capacity 500 towards the discharge curve 130 of FIG. 4 in a preferred embodiment of a method to carry out step 260 of FIG. 3. As compared to FIG. 5, discharge area 300D is still defined by line DD. A "fast" transition 520D replaces transition 320D. However, instead of avoiding the reporting of all transitions 330D that might increase reported capacity, a smaller charge "play" area 510D is defined by line CC and "slow" transitions 530D through the charge play area 510D are allowed. "Fast" and "slow" are relative to one another so that their cumulative long-term effect is to favour the reporting of capacity decreases when in the discharge state. For example, a "fast" transition might take 8.5 minutes to travel 80 percent of the distance to the discharge curve 130 whereas a "slow" transition might take 34.3 minutes. Note that transitions 330D outside the play area 510D still do not cause a change in the reported capacity.

FIG. 9 illustrates a transition from the last reported capacity towards the charge curve of FIG. 4 in a preferred embodiment of a method to carry out step 260 of FIG. 3. As compared to FIG. 6, charge area 300C is still defined by line CC. A "fast" transition 520C replaces transition 320C. However, instead of "banning" all transitions 330C that might decrease reported capacity, a smaller discharge "play" area 510C is defined by line DD and "slow" transitions 530C through the discharge "play" area 510C are allowed. "Fast" and "slow" are relative to one another so that their cumulative long-term effect is to favour the reporting of capacity increases when the battery is in the charge state. For example, a "fast" transition might take 1 minute to travel 80 percent of the distance to the discharge curve 130 whereas a "slow" transition might take 17.2 minutes. Note that transitions 330C outside the play area 510C still do not cause a change in the reported capacity.

FIG. 10 is a flowchart illustrating a preferred embodiment of a method to carry out step 260 of FIG. 3, in accordance to FIGS. 8 and 9.

At step 610, "fast" and "slow" transition rates are provided by system 10. These rates can differ depending on whether the battery is in a charge state or in a discharge state, as was described in reference to FIGS. 8 and 9.

At step 620, a target capacity is provided by the system 10. Preferably, the target capacity lies either on the charge curve 140 or the discharge curve 130 depending on whether the battery is in a charge state or a discharge state, respectively.

At step 640, a "play" region is provided by the system 10. Preferably, the "play" region varies with the slope of the charge 140 or discharge 130 curves, and is a function of the charge state. For instance, if the last reported capacity while charging is less than 7%, a 1% wide play region can be used, whereas if the last reported capacity is greater or equal to 7%, a 6% wide play region can be used. Similarly, if the last reported capacity while discharging is greater than 10%, a 6% wide play region can be used, whereas if the last reported capacity is smaller than or equal to 10%, a 1% wide play region can be used.

At step 640, a determination is made as to the charging state of battery 48, similar to step 240 already described in reference to FIG. 3. If the battery 48 is in the charging state, then step 650C is taken, as well as 660C or 670,680 or 690. Conversely, if the battery is in the discharging state, then step 650D is taken, as well as 660D or 670,680 or 690.

If the battery is in a charging state, at step 650C, the target capacity provided in step 620 is compared to the last reported capacity. If the target capacity is greater than the last reported capacity, then at step 660C a "fast" transition towards the charge target capacity ensues. However, if the target capacity is less than or equal to the last reported capacity, then at step 670, the target capacity is checked with respect to the "play" region. If the target capacity is within the play region, then at step 680 a "slow" transition towards the charge target capacity ensues. However, if the target capacity is outside the "play" region, then at step 690 the last reported capacity is used.

If the battery is in a discharging state, at step 650D, the target capacity provided in step 620 is compared to the last reported capacity. If the target capacity is less than the last reported capacity, then at step 660D a "fast" transition towards the discharge target capacity ensues. However, if the target capacity is greater or equal to the last reported capacity, then at step 670, the target capacity is checked with respect to the "play" region. If the target capacity is within the play region, then at step 680 a "slow" transition towards the discharge target capacity ensues. However, if the target capacity is outside the "play" region, then at step 690 the last reported capacity is used.

Although not expressly shown in the drawings, in another embodiment, a corrected battery voltage is computed before utilising the new charge curve. In order to compute the voltage correction, a measured battery current is taken from the battery. The value of the measured battery current can be positive or negative, depending on the direction of current flow into or out of the battery.

Using an effective serial resistance (ESR) for the battery, a battery voltage correction term is obtained by multiplying the value of the ESR for the battery and an estimated battery current. The corrected battery voltage is obtained by adding the battery voltage correction term to the estimated battery voltage while taking into account the direction of current flow in the addition. The estimated battery current can be determined by several ways, such as by measurement. The corrected battery voltage is utilised with the new charge curve in order to find a corresponding capacity.

As used in this description and in the appended claims, ESR corrected capacity reporting is defined as reporting a new capacity by correcting the battery voltage based on ESR and an estimated battery current prior to determining the capacity based on the corrected battery voltage.

Furthermore, in yet another embodiment, in order to keep the reported capacity from transitioning too abruptly, the reported capacity is affected with the value of the corresponding capacity progressively such that the reported capacity reaches the value of the corresponding capacity at a convergence rate which is selected from a multiplicity of convergence rates comprising a "fast" convergence rate and a "slow" convergence rate. The determination of which convergence rate to use is made as a function of the difference between the last reported capacity and the charge curve capacity, as well as the charge state of the battery. As used in this description and in the appended claims, progressive capacity reporting is defined as reporting a new capacity by a progression from an initial capacity to the new capacity over time.

Although not explicitly shown in the drawings, temperature corrections can be utilised throughout to ensure that the temperature of the battery is also taken into account.

The above method is typically implemented as an embodiment of charging subsystem 44. The system includes means for determining the voltage of the battery and its present charge state. These means provide the determined values to means for determining the target capacity. The target capacity is determined according to the methods described above and is then provided to a comparator, which compares the target capacity with previous capacity. The result of the comparison is used by target capacity adjusting means to adjust the target capacity value. The adjustment can use any combination of the methods described above to adjust the value of the battery capacity.

As illustrated in FIG. 1 the charging subsystem 44 has voltage reading means 700, charge state determining means 702, target capacity determining means 704, a comparator 706, whose functionality may be provided by microprocessor 38, and target capacity adjusting means 708. The voltage reading means 700 are operatively connected to the battery 48 to determine the voltage of the battery 48. The charge state determining means 702 are operatively connected to the battery 48 to determine the charging state of the battery 48. The target capacity determining means 704, are operatively connected to the voltage reading means 700 to receive the determined voltage and to the charge state determining means 702 to receive the determined charging state, so that they can compute a target battery capacity based on the determined voltage and the determined charging state. The comparator 706 is operatively connected to the memory 710, which may be flash memory 24, RAM 26 or another memory system, to receive the previous battery capacity value and to the target capacity determining means 704 to receive the target battery capacity. Comparator 706 generates a comparison signal representative of the comparison of the previous battery capacity value and the target battery capacity. The target capacity adjusting means 708 are operatively connected to the comparator 706 to receive the comparison signal, to the target capacity determining means 704 to receive the determined target battery capacity and to the charge state determining means 702 to receive the determined charging state. The target capacity adjusting means 708 adjust the determined target battery capacity if the comparison signal is not indicative of the determined charging state, and they also store the adjusted target battery capacity in the memory 710. Optionally, there may also be reporting means 712, operatively connected to the target capacity adjusting means 708 for reporting the adjusted target battery capacity.

In various embodiments, the target capacity adjusting means 708 further includes means for a number of functions. One such function is to adjust the determined target capacity to a capacity determined from a predefined fast transition curve that models the relationship between the determined battery voltage, the determined present charging state and battery capacity after a change in charging state. Another such function is to adjust the target capacity to a capacity determined from a predefined slow transition curve that models the relationship between the determined battery voltage, the determined present charging state and battery capacity when the target capacity is in a play region around the capacity of the battery when the last change in charging state occurred.

In another embodiment the target capacity adjusting means 708 is also connected to an effective serial resistance tester 714 which is operatively connected to the battery 48 to determine an effective serial resistance correction factor, the target capacity adjusting means 708 further includes means for adjusting the target capacity based on the effective serial resistance correction factor. In embodiment of the present invention, the above described system is integrated into a handheld computing or communicating device.

The above-described aspects of the invention provide a system and method that mitigate the uncertainty in battery capacity reporting resulting from the transition between the charge and discharge curves of the battery model that are present in the prior art. Additionally the present invention accounts for the plastic relationship between battery voltage and battery capacity.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for reporting an available capacity of a rechargeable battery, comprising:
   reporting the available capacity of the rechargeable battery based on a measured battery voltage;
   detecting a change in state of the rechargeable battery between a discharge state and a charge state;
   if the detected state change is from the charge state to the discharge state, then reporting only decreases in the available capacity until another state change is detected; and
   if the detected state change is from the discharge state to the charge state, then reporting only increases in the available capacity until another state change is detected.

2. The method of claim 1, wherein the available capacity is determine from the measured battery voltage using a capacity model.

3. The method of claim 2, wherein:
   if the rechargeable battery is in the discharge state, then the available capacity is determined using a discharge curve from the capacity model; and
   if the rechargeable battery is in the charge state, then the available capacity is determined using a charge curve from the capacity model.

4. The method of claim 1, further comprising:
   if the detected state change is from the charge state to the discharge state and a determined value of the available capacity has increased from a last reported capacity, then continuing to report the last reported capacity; and
   if the detected state change is from the discharge state to the charge state and the determined value of the available capacity has decreased from the last reported capacity, then continuing to report the last reported capacity.

5. The method of claim 1, wherein the determination as to whether the available capacity is increasing or decreasing is made by comparing a candidate capacity with a last reported capacity.

6. The method of claim 1, wherein the measured battery voltage is corrected based on a measured battery current and an effective serial resistance, and wherein the reported available capacity is determined based on the corrected measured battery voltage.

7. The method of claim 6, wherein the measured battery voltage is further corrected to compensate for temperature fluctuations.

8. A method for reporting an available capacity of a rechargeable battery, comprising:
   reporting the available capacity of the rechargeable battery based on a measured battery voltage;
   detecting a change in state of the rechargeable battery between a discharge state and a charge state;
   if the detected state change is from the charge state to the discharge state, then using a fast convergence rate to report the battery available capacity if the measured battery voltage is decreasing and using a slow convergence rate to report the available battery capacity if the measured battery voltage is increasing; and
   if the detected state change is from the discharge state to the charge state, then using the fast convergence rate to report the available battery capacity if the measured battery voltage is increasing and using the slow convergence rate to report the available battery capacity if the measured battery voltage is decreasing.

9. The method of claim 8, further comprising:
   if the slow convergence rate is to be used to report the available battery capacity, then first determining if a target battery capacity to be reported using the slow convergence rate is within a play range of a last reported capacity, and if the target battery capacity is not within the play range, then continuing to report the last reported capacity.

10. The method of claim 8, wherein the available capacity is determine from the measured battery voltage using a capacity model.

11. The method of claim 10, wherein:
    if the rechargeable battery is in the discharge state, then the available capacity is determined using a discharge curve from the capacity model; and
    if the rechargeable battery is in the charge state, then the available capacity is determined using a charge curve from the capacity model.

12. The method of claim 9, wherein the play range is determined as a function of the state of the rechargeable battery and the last reported capacity.

13. The method of claim 8, wherein the measured battery voltage is corrected based on a measured battery current and an effective serial resistance, and wherein the reported available capacity is determined based on the corrected measured battery voltage.

14. The method of claim 13, wherein the measured battery voltage is further corrected to compensate for temperature fluctuations.

15. A handheld device having a system for reporting an available capacity of a rechargeable battery, comprising:
    a charging subsystem configured to determining the available capacity of the rechargeable battery based on a measured battery voltage;
    a user interface configured to report the available capacity;
    the charging subsystem being further configured to detect a change in state of the rechargeable battery between a discharge state and a charge state;
    wherein if the detected state change is from the charge state to the discharge state, then the charging subsystem being configured to report only decreases in the available capacity until another state change is detected; and
    wherein if the detected state change is from the discharge state to the charge state, then the charging subsystem being configured to report only increases in the available capacity until another state change is detected.

16. The handheld device of claim 15, wherein
if the detected state change is from the charge state to the discharge state and a determined value of the available capacity has increased from a last reported capacity, then the charging subsystem being configured to continue reporting the last reported capacity; and
if the detected state change is from the discharge state to the charge state and the determined value of the available capacity has decreased from the last reported capacity, then the charging subsystem being configured to continue reporting the last reported capacity.

17. The handheld device of claim 15, wherein the charging subsystem determines whether the available capacity is increasing or decreasing by comparing a candidate capacity with a last reported capacity.

18. A handheld device having a system for reporting an available capacity of a rechargeable battery, comprising:
a charging subsystem configured to determining the available capacity of the rechargeable battery based on a measured battery voltage;
a user interface configured to report the available capacity;
the charging subsystem being further configured to detect a change in state of the rechargeable battery between a discharge state and a charge state;
wherein if the detected state change is from the charge state to the discharge state, then the charging subsystem being configured to use a fast convergence rate to report the battery available capacity if the measured battery voltage is decreasing and to use a slow convergence rate to report the available battery capacity if the measured battery voltage is increasing; and
wherein if the detected state change is from the discharge state to the charge state, then the charging subsystem being configured to use the fast convergence rate to report the available battery capacity if the measured battery voltage is increasing and to use the slow convergence rate to report the available battery capacity if the measured battery voltage is decreasing.

19. The handheld device of claim 18, wherein if the slow convergence rate is to be used to report the available battery capacity, then the charging subsystem being configured to determine if a target battery capacity to be reported using the slow convergence rate is within a play range of a last reported capacity, and if the target battery capacity is not within the play range, then continuing to report the last reported capacity.

20. The handheld device of claim 19, wherein the play range is determined as a function of the state of the rechargeable battery and the last reported capacity.

* * * * *